United States Patent
Seshita et al.

(10) Patent No.: US 8,170,500 B2
(45) Date of Patent: May 1, 2012

(54) RADIO-FREQUENCY SWITCH CIRCUIT

(75) Inventors: Toshiki Seshita, Kanagawa-ken (JP); Hirotsugu Wakimoto, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 371 days.

(21) Appl. No.: 12/500,020

(22) Filed: Jul. 9, 2009

(65) Prior Publication Data
US 2010/0073066 A1 Mar. 25, 2010

(30) Foreign Application Priority Data
Sep. 25, 2008 (JP) .................................. 2008-246659

(51) Int. Cl.
*H04B 1/44* (2006.01)
(52) U.S. Cl. ........ 455/78; 455/333; 455/114.1; 333/103
(58) Field of Classification Search .................... 455/78, 455/62, 63.1, 63.3, 82, 83, 191.3, 333, 114.1, 455/114.2, 278.1, 296, 277.1, 197.1; 330/149, 330/150; 333/103, 104, 101, 262; 327/408, 327/430, 435, 436, 416, 427
See application file for complete search history.

(56) References Cited

U.S. PATENT DOCUMENTS

| | | | |
|---|---|---|---|
| 2006/0194558 A1 | 8/2006 | Kelly et al. | |
| 2006/0261912 A1* | 11/2006 | Miyagi et al. | 333/103 |
| 2007/0018247 A1 | 1/2007 | Brindle et al. | |
| 2007/0290744 A1* | 12/2007 | Adachi et al. | 330/51 |
| 2009/0181630 A1 | 7/2009 | Seshita et al. | |

FOREIGN PATENT DOCUMENTS

JP    2005-515657    5/2005

* cited by examiner

*Primary Examiner* — Ping Hsieh
(74) *Attorney, Agent, or Firm* — Turocy & Watson, LLP

(57) ABSTRACT

A radio-frequency switch circuit of the invention includes: n-stage through FETs (field effect transistors) connected in series between the antenna terminal and each of the radio-frequency terminals, where n is a natural number; a radio-frequency leakage prevention resistor connected to a gate of the through FETs; a control signal line commonly connected to the gates of the n-stage through FETs connected to the same radio-frequency terminal; and a resistor connected to each of at least two of the control signal lines and connected to the radio-frequency leakage prevention resistor in series The two control signal lines are capacitively coupled between the resistor and the through FETs.

20 Claims, 12 Drawing Sheets

RADIO-FREQUENCY SWITCH CIRCUIT

CROSS-REFERENCE TO RELATED APPLICATIONS

This application is based upon and claims the benefit of priority from the prior Japanese Patent Application No. 2008-246659, filed on Sep. 25, 2008; the entire contents of which are incorporated herein by reference.

BACKGROUND OF THE INVENTION

1. Field of the Invention

This invention relates to a radio-frequency switch circuit for switching signal paths between an antenna terminal and two or more radio-frequency terminals.

2. Background Art

A multiport radio-frequency switch circuit such as SP6T (single-pole 6-throw) is used, for example, in a multimode, multiband wireless device. In this circuit, multistage series connected through FETs (field effect transistors) are provided between an antenna terminal and each of six radio-frequency terminals, and multistage series connected shunt FETs are provided between each radio-frequency terminal and the ground.

For example, to conduct between the first radio-frequency terminal and the antenna terminal, n-stage connected through FETs between the first radio-frequency terminal and the antenna terminal are turned on, and m-stage series connected shunt FETs between the first radio-frequency terminal and the ground are turned off. At the time, the through FETs between the other radio-frequency terminals and the antenna terminal are all turned off, and all of the shunt FETs between the other radio-frequency terminals and the ground are turned on.

The radio-frequency switch circuit has a problem of harmonic distortion or intermodulation distortion that occurs when a transmitted radio-frequency signal passes through the circuit. This results from nonlinear characteristics of FETs used as switch elements. The distortions can be classified into on-distortion and off- distortion. On-distortion occurs due to the nonlinearity of on-resistance when the FET is in an on-state. And off-distortion occurs due to the nonlinearity of off-capacitance when the FET is in an off-state. The off-distortion is relevant to multiport switches, because one through FET is in the on-state, whereas the number of through FETs in the off-state is the number of ports minus one. In particular, it is important, for UMTS (Universal Mobile Telecommunications System) ports, to suppress third-order intermodulation distortion IMD3 below a system requirements (e.g., −110 dBm).

JP-A-2005-515657 (Kokai) discloses a technique related to a switch circuit and a method for switching radio-frequency signals, which are based on SOI (silicon on insulator) technology and available for wireless applications. This technique proposes an RF switch circuit including a group of a first and second switching transistor and a group of a first and second shunting transistor, and allowing easy integration. However, even using this technique, it is not easy to reduce IMD3 so as to meet the UMTS requirements without increasing a chip size of the radio-frequency switch circuit.

SUMMARY OF THE INVENTION

According to an aspect of the invention, there is provided a radio-frequency switch circuit including: an antenna terminal; two or more radio-frequency terminals; n-stage through FETs (field effect transistors) connected in series between the antenna terminal and each of the radio-frequency terminals, where n is a natural number; a radio-frequency leakage prevention resistor connected to a gate of the through FETs; a control signal line commonly connected to the gates of the n-stage through FETs connected to the same radio-frequency terminal; and a resistor connected to each of at least two of the control signal lines and connected to the radio-frequency leakage prevention resistor in series, the two control signal lines being capacitively coupled between the resistor and the through FETs.

According to another aspect of the invention, there is provided a radio-frequency switch circuit including: an antenna terminal; two or more radio-frequency terminals; n-stage through FETs (field effect transistors) connected in series between the antenna terminal and each of the radio-frequency terminals, where n is a natural number; a through FET radio-frequency leakage prevention resistor connected to a gate of the through FETs; a through FET control signal line commonly connected to the gates of the n-stage through FETs connected to the same radio-frequency terminal; a through FET resistor connected to the through FET control signal line and connected to the through FET radio-frequency leakage prevention resistor in series; m-stage shunt FETs connected in series between each of the radio-frequency terminals and the ground, where m is a natural number; a shunt FET radio-frequency leakage prevention resistor connected to a gate of the shunt FETs; a shunt FET control signal line commonly connected to the gates of the m-stage shunt FETs connected to the same radio-frequency terminal; and a shunt FET resistor connected to the shunt FET control signal line and connected to the shunt FET radio-frequency leakage prevention resistor in series, the through FET control signal line between the through FET resistor and the through FETs, and the shunt FET control signal line between the shunt FET resistor and the shunt FETs being capacitively coupled.

DETAILED DESCRIPTION OF THE INVENTION

Figure 1:
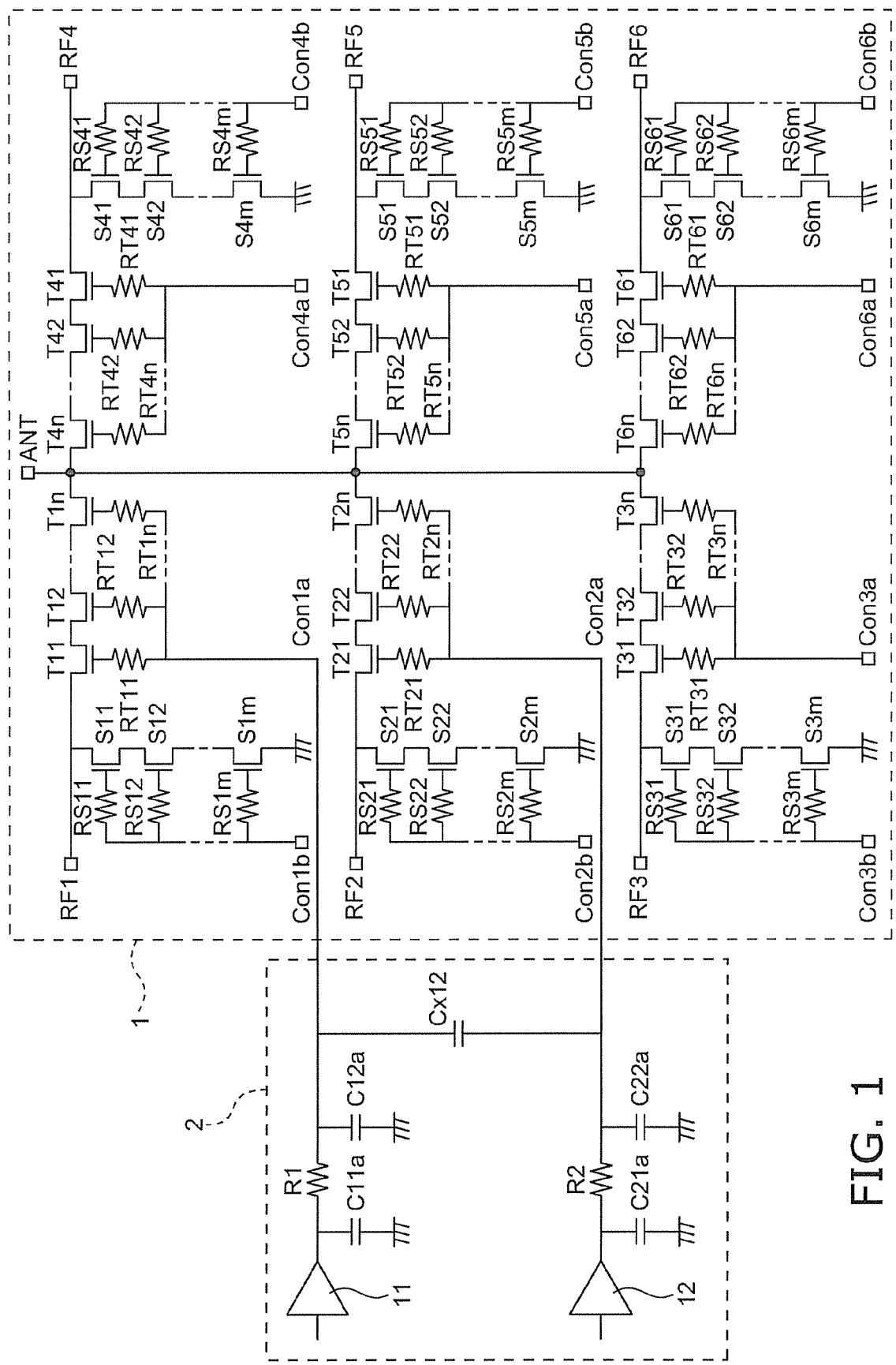
FIG. 1 is a circuit diagram illustrating a radio-frequency switch circuit according to a first embodiment of the invention.

Embodiments of the invention will now be described with reference to the drawings, where substantially the same elements are labeled with like reference numerals.

First Embodiment

FIG. 1 is a circuit diagram illustrating a radio-frequency switch circuit according to a first embodiment of the invention. This embodiment is an example application of the invention to a multiport radio-frequency switch circuit such as SP6T (single-pole 6-throw).

The radio-frequency switch circuit according to this embodiment includes a radio-frequency switch section 1 for switching a state of connection between an antenna terminal ANT and a plurality of (six, in this embodiment) radio-frequency terminals RF1-RF6, and a control circuit section 2 for supplying a control signal to the radio-frequency switch section 1, which are formed as a semiconductor integrated circuit on the same semiconductor substrate (semiconductor chip).

Through FETs (field effect transistors) T{i,j} of n-stage (where n is a natural number) are connected in series between the antenna terminal ANT and each of the radio-frequency terminals RF1-RF6. The through FETs T11, T12, ..., T1n are connected between the antenna terminal ANT and the radio-frequency terminal RF1. The through FETs T21, T22, ..., T2n are connected between the antenna terminal ANT and the radio-frequency terminal RF2. The through FETs T31, T32, ..., T3n are connected between the antenna terminal ANT and the radio-frequency terminal RF3. The through FETs T41, T42, ..., T4n are connected between the antenna terminal ANT and the radio-frequency terminal RF4. The through FETs T51, T52, ..., T5n are connected between the antenna terminal ANT and the radio-frequency terminal RF5. The through FETs T61, T62, ..., T6n are connected between the antenna terminal ANT and the radio-frequency terminal RF6.

Shunt FETs S{i,j} of m-stage (where m is a natural number) are connected in series between each of the radio-frequency terminals RF1-RF6 and the ground. The shunt FETs S11, S12, ..., S1m are connected between the radio-frequency terminal RF1 and the ground. The shunt FETs S21, S22, ..., S2m are connected between the radio-frequency terminal RF2 and the ground. The shunt FETs S31, S32, S3m are connected between the radio-frequency terminal RF3 and the ground. The shunt FETs S41, S42, ..., S4m are connected between the radio-frequency terminal RF4 and the ground. The shunt FETs S51, S52, ..., S5m are connected between the radio-frequency terminal RF5 and the ground. The shunt FETs S61, S62, ..., S6m are connected between the radio-frequency terminal RF6 and the ground.

Gates of the through FETs T11, T12, ..., T1n connected to the radio-frequency terminal RF1 are connected to a control signal line (or control signal node) Con1a via radio-frequency leakage prevention resistors RT11, RT12, ..., RT1n, respectively. The control signal line Con1a is connected to a driver 11 in the control circuit section 2. Each of the resistors RT11, RT12, RT1n has a high resistance enough to prevent radio-frequency signals from leaking to the control circuit section 2.

Gates of the shunt FETs S11, S12, ..., S1m connected to the radio-frequency terminal RF1 are connected to a control signal line (or control signal node) Con1b via radio-frequency leakage prevention resistors RS11, RS12, ..., RS1m, respectively. The control signal line Con1b is connected to a driver in the control circuit section 2. Each of the resistors RS11, RS12, ..., RS1m has a high resistance enough to prevent radio-frequency signals from leaking to the control circuit section 2.

Gates of the through FETs T21, T22, ..., T2n connected to the radio-frequency terminal RF2 are connected to a control signal line (or control signal node) Con2a via radio-frequency leakage prevention resistors RT21, RT22, ..., RT2n, respectively. The control signal line Con2a is connected to a driver 12 in the control circuit section 2. Each of the resistors RT21, RT22, RT2n has a high resistance enough to prevent radio-frequency signals from leaking to the control circuit section 2.

Gates of the shunt FETs S21, S22, ..., S2m connected to the radio-frequency terminal RF2 are connected to a control signal line (or control signal node) Con2b via radio-frequency leakage prevention resistors RS21, RS22, ..., RS2m, respectively. The control signal line Con2b is connected to a driver in the control circuit section 2. Each of the resistors RS21, RS22, ..., RS2m has a high resistance enough to prevent radio-frequency signals from leaking to the control circuit section 2.

Gates of the through FETs T31, T32, ..., T3n connected to the radio-frequency terminal RF3 are connected to a control signal line (or control signal node) Con3a via radio-frequency leakage prevention resistors RT31, RT32, ..., RT3n, respectively. The control signal line Con3a is connected to a driver in the control circuit section 2. Each of the resistors RT31, RT32, ..., RT3n has a high resistance enough to prevent radio-frequency signals from leaking to the control circuit section 2.

Gates of the shunt FETs S31, S32, ..., S3m connected to the radio-frequency terminal RF3 are connected to a control signal line (or control signal node) Con3b via radio-frequency leakage prevention resistors RS31, RS32, ..., RS3m, respectively. The control signal line Con3b is connected to a driver in the control circuit section 2. Each of the resistors RS31, RS32, ..., RS3m has a high resistance high enough to prevent radio-frequency signals from leaking to the control circuit section 2.

Gates of the through FETs T41, T42, ..., T4n connected to the radio-frequency terminal RF4 are connected to a control signal line (or control signal node) Con4a via radio-frequency leakage prevention resistors RT41, RT42, ..., RT4n, respectively. The control signal line Con4a is connected to a driver in the control circuit section 2. Each of the resistors RT41, RT42, ..., RT4n has a high resistance enough to prevent radio-frequency signals from leaking to the control circuit section 2.

Gates of the shunt FETs S41, S42, ..., S4m connected to the radio-frequency terminal RF4 are connected to a control signal line (or control signal node) Con4b via radio-frequency leakage prevention resistors RS41, RS42, ..., RS4m, respectively. The control signal line Con4b is connected to a driver in the control circuit section 2. Each of the resistors RS41, RS42, ..., RS4m has a high resistance enough to prevent radio-frequency signals from leaking to the control circuit section 2.

Gates of the through FETs T51, T52, ..., T5n connected to the radio-frequency terminal RF5 are connected to a control signal line (or control signal node) Con5a via radio-frequency leakage prevention resistors RT51, RT52, ..., RT5n, respectively. The control signal line Con5a is connected to a driver in the control circuit section 2. Each of the resistors RT51, RT52, ..., RT5n has a high resistance enough to prevent radio-frequency signals from leaking to the control circuit section 2.

Gates of the shunt FETs S51, S52, ..., S5m connected to the radio-frequency terminal RF5 are connected to a control signal line (or control signal node) Con5b via radio-frequency leakage prevention resistors RS51, RS52, ..., RS5m, respectively. The control signal line Con5b is connected to a driver in the control circuit section 2. Each of the resistors RS51, RS52, ..., RS5m has a high resistance enough to prevent radio-frequency signals from leaking to the control circuit section 2.

Gates of the through FETs T61, T62, ..., T6n connected to the radio-frequency terminal RF6 are connected to a control signal line (or control signal node) Con6a via radio-frequency leakage prevention resistors RT61, RT62, ..., RT6n, respectively. The control signal line Con6a is connected to a driver in the control circuit section 2. Each of the resistors RT61, RT62, ..., RT6n has a high resistance enough to prevent radio-frequency signals from leaking to the control circuit section 2.

Gates of the shunt FETs S61, S62, ..., S6m connected to the radio-frequency terminal RF6 are connected to a control signal line (or control signal node) Con6b via radio-frequency leakage prevention resistors RS61, RS62, ..., RS6m, respectively. The control signal line Con6b is connected to a driver in the control circuit section 2. Each of the resistors RS61, RS62, ..., RS6m has a high resistance enough to prevent radio-frequency signals from leaking to the control circuit section 2.

For example, the through FETs T11, T12, ..., T1n and the shunt FETs S11, S12, ..., S1m are controlled as follows by the gate control signal supplied from the control circuit section 2 via the control signal lines Con1a, Con1b to conduct between the radio-frequency terminal RF1 and the antenna terminal ANT.

All of the through FETs T11, T12, ..., T1n connected between the radio-frequency terminal RF1 and the antenna terminal ANT are turned on, and all of the shunt FETs S11, S12, ..., S1m connected between the radio-frequency terminal RF1 and the ground are turned off. Simultaneously, all of the through FETs between each of the other radio-frequency terminals RF2-RF6 and the antenna terminal ANT are turned off, and all of the shunt FETs between each of the other radio-frequency terminals RF2-RF6 and the ground are turned on.

The shunt FETs enhance isolation between the antenna terminal and the radio-frequency terminal to which the shunt FETs are connected, when the through FETs connected to that radio-frequency terminal are turned off. More specifically, even if the through FETs are in the off-state, a radio-frequency signal may leak to the radio-frequency terminal connected to those through FETs in the off-state. However, at this time, the leaked radio-frequency signal can be released to the ground via the shunt FETs in the on-state.

In this embodiment, the control signal lines Con1a-Con6a for through FETs are respectively associated with the radio-frequency terminals RF1-RF6. At least two control signal lines (e.g., the control signal line Con1a and the control signal line Con2a) have resistors R1, R2 respectively inserted in series therein. The resistor R1 is inserted in series on an output side of the driver 11, and the resistor R2 is inserted in series on an output side of the driver 12.

The two control signal lines Con1a, Con2a with the resistors R1, R2 respectively inserted therein are adjacently laid out via an insulating layer into a parallel pattern on the semiconductor substrate so that terminals of the resistors R1, R2 on the through FET side are capacitively coupled to each other. This capacitance between the control signal lines Con1a, Con2a is denoted by Cx12 in FIG. 1.

Furthermore, a capacitor C11a is provided between the ground and a node between the resistor R1 and the output terminal of the driver 11. A capacitor C21a is provided between the ground and a node between the resistor R2 and the output terminal of the driver 12.

MOSFET (metal-oxide-semiconductor field effect transistor) or MISFET (metal-insulator-semiconductor field effect transistor), constituting the through FETs and shunt FETs described above, is formed into a semiconductor device of the SOI (silicon on insulator) structure.

Figure 9:
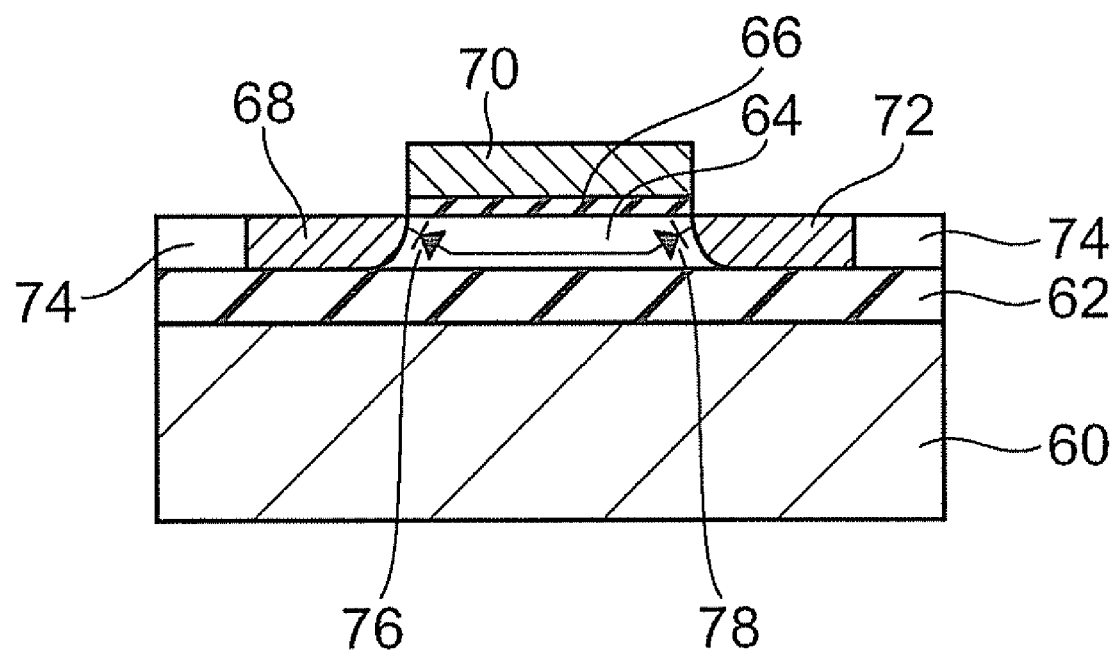
FIG. 9 is a schematic cross-sectional view of a MOSFET having a SOI structure.

FIG. 9 shows a schematic cross-sectional view of the semiconductor device of the SOI structure.

A buried oxide layer 62 is provided on a main surface side of a silicon substrate 60, and a SOI layer 64 is provided thereon. A source region 68 and a drain region 72 are selectively formed in the SOI layer 64, and a gate electrode 70 is provided via a gate insulating film 66 on the SOI layer 64 between the source region 68 and the drain region 72. The MOSFET device thus configured is insulated and isolated from other devices by a device isolation layer 74.

This MOSFET is illustratively an n-channel type. In the off-state, holes are accumulated in a channel. A parasitic diode 76 is formed between the accumulated holes (back gate) and the source region 68, and a parasitic diode 78 is formed between the back gate and the drain region 72. A combined capacitance of a junction capacitances of these parasitic diodes 76, 78 has nonlinearity with respect to a drain-source voltage, and causes an off-distortion. The off-distortion can be reduced by increasing the number of connection stages of the through FETs between each of the radio-frequency terminals RF1-RF6 and the antenna terminal ANT. When the number of connection stages of the through FETs is increased, an amplitude of the drain-source voltage applied per the stage is decreased. However, increasing the number of connection stages leads to increased chip area.

In this embodiment, at least two control signal lines Con1a, Con2a for through FETs have high-resistance resistors R1, R2 respectively inserted in series therein, and an output sides of these resistors R1, R2 are capacitively coupled. Thus, as described below, this embodiment can achieve a distortion compensation effect on the off-distortion so that, in particular, third-order intermodulation distortion IMD3 can be significantly reduced.

The resistors R1, R2 have a high resistance, such as 10 k$\Omega$, and the capacitors C11a, C21a have a high capacitance, such as several pF order. Hence, an input side of the resistors R1, R2 is nearly equivalent to being grounded for a radio-frequency signal at approximately 1-2 GHz. It is noted that in FIG. 1, capacitors C12a, C22a are capacitances to ground of the control signal lines Con1a, Con2a, respectively, and the typical value thereof is several ten to several hundred fF (femtofarad) order.

Suppose now that conduction is established between the radio-frequency terminal RF1 and the antenna terminal ANT. A path between each of the other radio-frequency terminals RF2-RF6 and the antenna terminal ANT is in a blocked state. At this time, the through FETs T11-T1n are in the on-state. When a radio-frequency signal inputted from the radio-frequency terminal RF1 passes through the through FETs T11-T1n, the radio-frequency signal leaks to the control signal line Con1a via a gate capacitance of the through FETs T11-T1n. Because the control signal line Con1a has a high resistance R1 inserted therein, the control signal line Con1a has high impedance, and the radio-frequency signal is superimposed on the control signal line Con1a. Furthermore, the control signal line Con2a, which is capacitively coupled to the control signal line Con1a via the capacitance Cx12, also has a high resistance R2 inserted therein and has high impedance. Thus, the radio-frequency signal is superimposed also on the control signal line Con2a via the capacitance Cx12. a part of the radio-frequency signal inputted from the radio-frequency terminal RF1 is superimposed on the control signal line Con2a with a certain phase difference via the RC circuit network like that.

An impedance of a gate capacitance of the through FETs T11-T1n in the on-state is sufficiently smaller than that of high resistance of resistors RT11-RT1n connected to each gate, and hence is negligible in considering the aforementioned RC circuit network. Thus, in the aforementioned RC circuit network, it is necessary to consider only the parallel-connected resistance of the resistors RT11-RT1n, the capacitances to ground C12a, C22a of the control signal lines Con1a, Con2a, the coupling capacitance Cx12, and the resistors R1, R2.

A phase difference between the radio-frequency signal inputted from the radio-frequency terminal RF1 and the radio-frequency signal superimposed on the control signal line Con2a can be easily set to 60 degrees by adjusting these capacitances and resistances, and it is set that in this embodiment. Thus, the radio-frequency signal having a phase difference of 60° with respect to the radio-frequency signal inputted from the radio-frequency terminal RF1 is applied to the gate of the through FETs T21-T2n in the off-state via the control signal line Con2a.

The through FETs connected to each of the radio-frequency terminals RF1-RF6 are connected to a common line connected to the antenna terminal ANT, and the original radio-frequency signal without 60 degrees phase shift is applied between the drain and the source of the through FETs T21-T2n. This radio-frequency signal causes third-order off-distortion (referred to as first distortion) in the through FETs T21-T2n. In addition, the aforementioned radio-frequency signal with a phase difference of 60 degrees applied to the gate via the control signal line Con2a also causes third-order off-distortion (referred to as second distortion). Because of the 60 degrees phase difference in a fundamental frequency, the phase difference between the third-order first distortion and the third-order second distortion is three times 60 degrees, that is, 180 degrees.

Hence, when the second distortion has a suitable intensity, the second distortion can cancel out sum of the aforementioned first distortion for the through FETs in the off-state connected to the radio-frequency terminal RF2 and the third-order off-distortion generated by the through FETs in the off-state connected to the radio-frequency terminals RF3-RF6. Thus, the intensity of the second distortion needs to be matched with the total intensity of the first distortion and the third-order off-distortion generated by the through FETs in the off-state connected to the radio-frequency terminals RF3-RF6.

Figure 2:
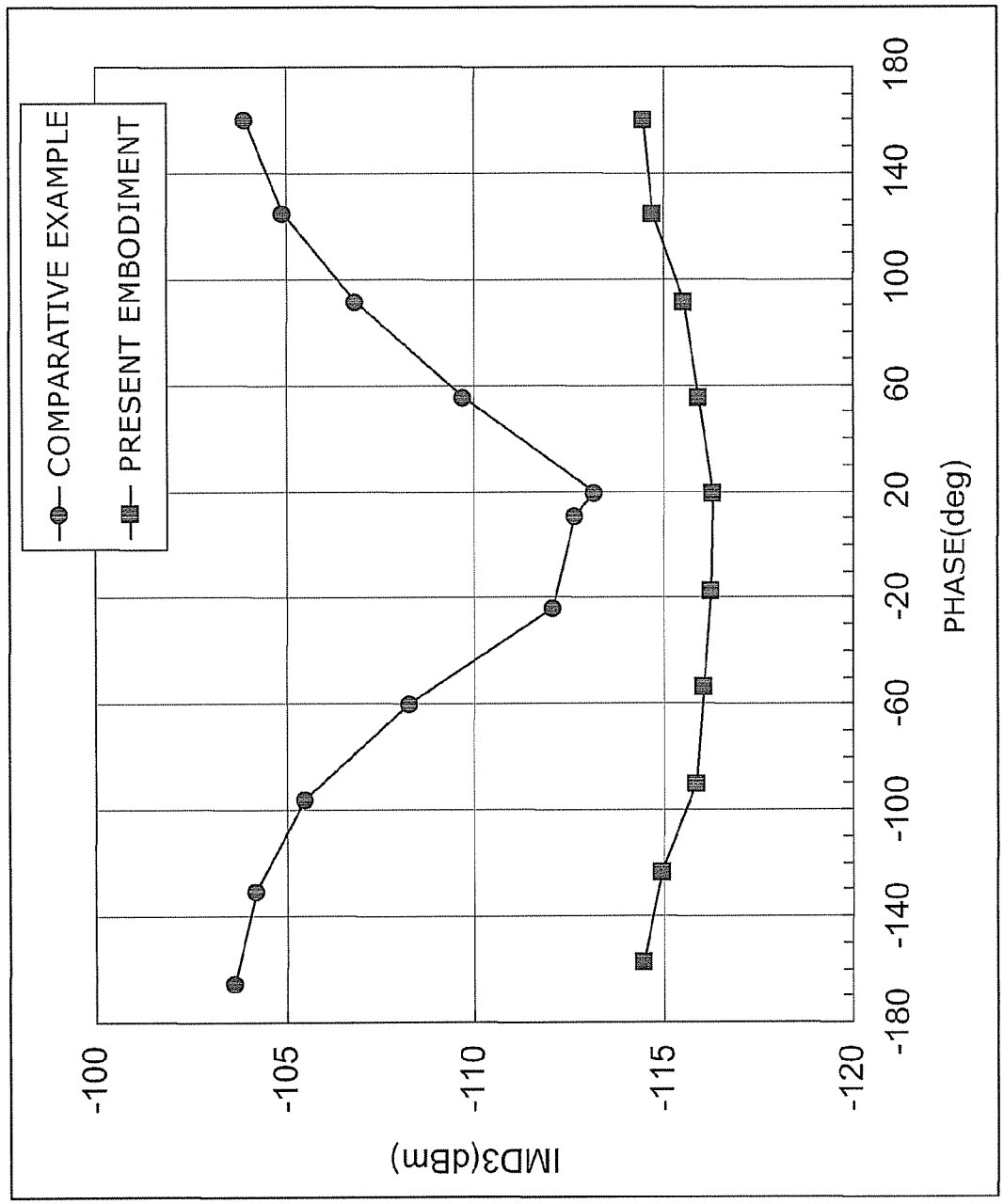
FIG. 2 shows a graph on a result of comparing a phase characteristics of third-order intermodulation distortion IMD3 between the embodiment of the invention and a comparative example.

FIG. 2 shows a result of comparing phase characteristics of third-order intermodulation distortion IMD3 (dBm) between the embodiment described above with reference to FIG. 1 and a comparative example which is different from this embodiment in lacking R1, R2, C11a, C21a, and Cx12.

Here, "phase" on the horizontal axis refers to a phase difference between a signal wave and a reflected wave occurring in a transmission path between the radio-frequency terminal RF1 and a duplexer of a UMTS (Universal Mobile Telecommunications System) transceiver circuit provided at the preceding stage thereof. IMD3 is defined as the worst value obtained when the aforementioned "phase" is swept.

From a result of FIG. 2, the embodiment of the invention successfully improves the third-order intermodulation distortion IMD3 by approximately 11 dB relative to the comparative example. That is, according to this embodiment, IMD3 can be reduced without increasing the number of stages of through FETs, and hence reduction of IMD3 does not involve increased chip area.

Here, constants specifying the FET characteristics of the through FETs T11-T1n connected to the radio-frequency terminal RF1 are equal to those of the through FETs T21-T2n connected to the radio-frequency terminal RF2. Hence, the radio-frequency terminal RF1 and the radio-frequency terminal RF2 are equivalent. Thus, in FIG. 1, IMD3 can be reduced not only in the case where conduction is established between the radio-frequency terminal RF1 and the antenna terminal ANT, but also in the case where conduction is established between the radio-frequency terminal RF2 and the antenna terminal ANT whereas the path between each of the other radio-frequency terminals RF1, RF3-RF6 and the antenna terminal ANT is in the blocked state.

Figure 3:
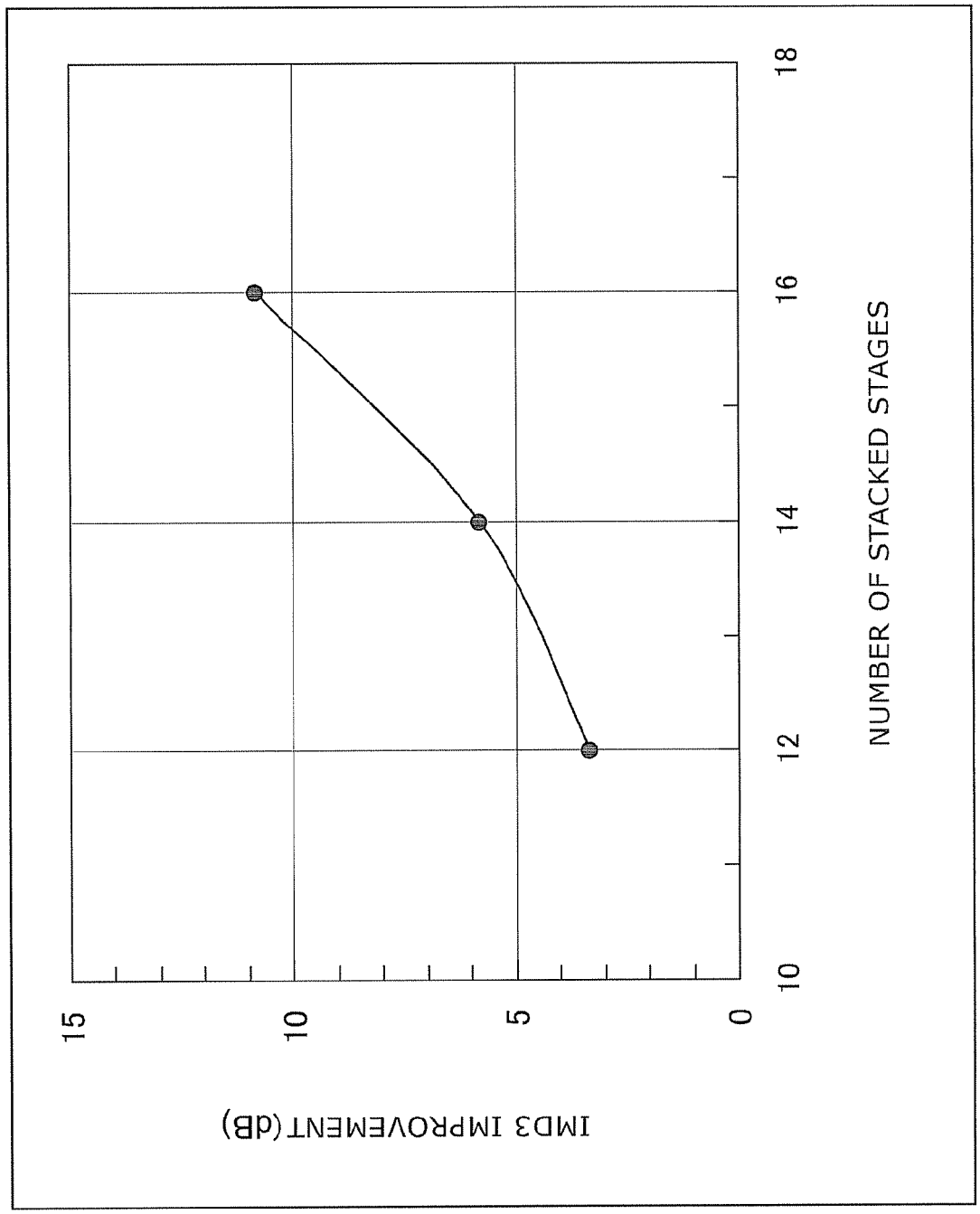
FIG. 3 shows a graph on a result of an experiment on a relationship between numbers of stacked stages of through FETs between each radio-frequency terminal and an antenna terminal versus IMD3 improvement.

FIG. 3 shows a result of an experiment on a radio-frequency switch section 1 shown in FIG. 1 for determining a relationship between the number of stacked stages of through FETs between each radio-frequency terminal and the antenna terminal versus IMD3 improvement (dB) achieved by application of the above embodiment of the invention.

From the result of this experiment, the effect of IMD3 improvement is significant when the number of stacked stages of through FETs is 12 or more. Thus, it is preferable to apply the embodiment of the invention to the case where the number of stacked stages of through FETs is 12 or more.

Although an SP6T (single-pole 6-throw) switch is described as an example in this embodiment, it is understood that the invention is generally applicable to SPnT (where n is an integer of two or more) switches.

Second Embodiment

Figure 4:
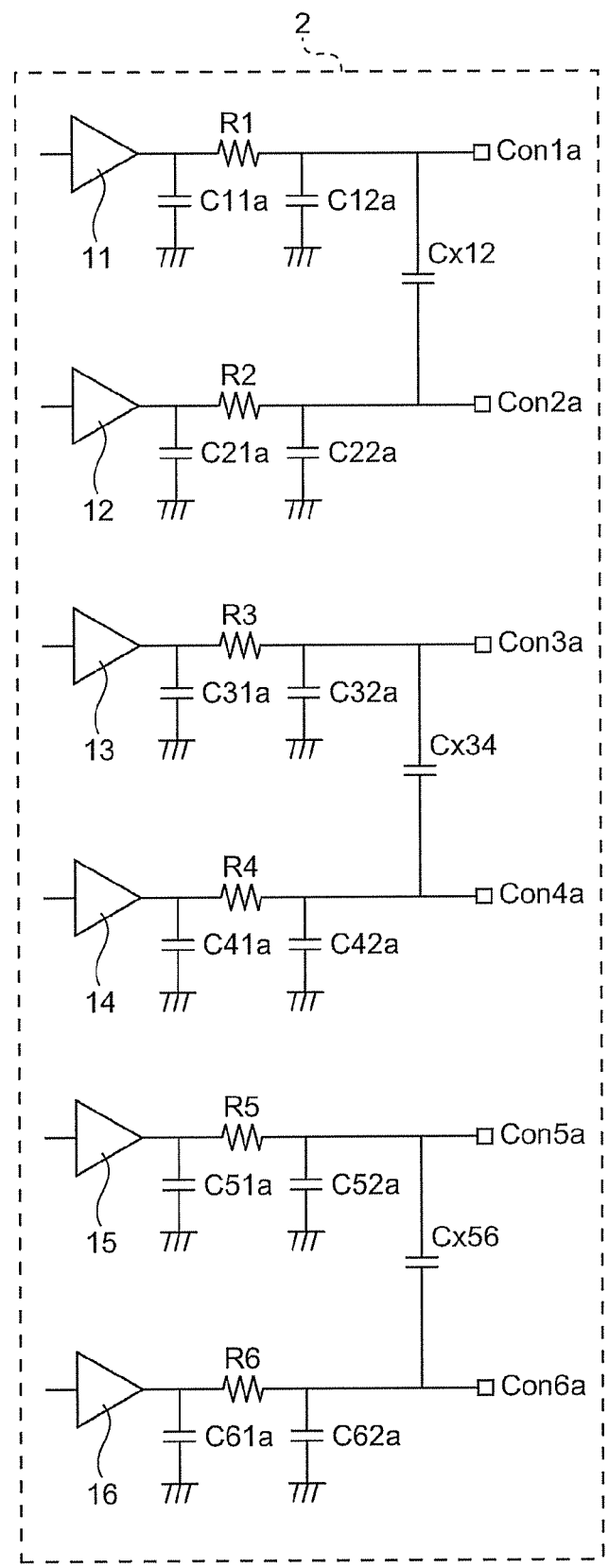
FIG. 4 is a circuit diagram illustrating a control circuit section in a radio-frequency switch circuit according to a second embodiment of the invention.

FIG. 4 is a circuit diagram illustrating a control circuit section 2 in a radio-frequency switch circuit according to a second embodiment of the invention.

In the radio-frequency switch section 1 described above with reference to FIG. 1, FET constants of the through FETs T11-T1n, T21-T2n, T31-T3n, T41-T4n, T51-T5n, T61-T6n respectively connected to the radio-frequency terminals RF1-RF6 are equal. Hence, the radio-frequency terminals RF1-RF6 are equivalent.

This embodiment applies the pairing of the control signal line Con1a and the control signal line Con2a as illustrated in the first embodiment also to the other control signal lines, providing three pairs in total. This allows IMD3 improvement for all the radio-frequency terminals RF1-RF6.

More specifically, a control signal line Con3a connected to a gate of the through FETs T31-T3n connected between the radio-frequency terminal RF3 and the antenna terminal ANT, and a control signal line Con4a connected to a gate of the through FETs T41-T4n connected between the radio-frequency terminal RF4 and the antenna terminal ANT have resistors R3, R4 respectively inserted in series therein. Terminals of these resistors R3, R4 on the through FET side are capacitively coupled to each other.

Furthermore, a capacitor C31a is provided between the ground and a node between the resistor R3 and an output terminal of the driver 13. A capacitor C41a is provided between the ground and a node between the resistor R4 and an output terminal of the driver 14.

Likewise, a control signal line Con5a connected to a gate of the through FETs T51-T5n connected between the radio-frequency terminal RF5 and the antenna terminal ANT, and a control signal line Con6a connected to a gate of the through FETs T61-T6n connected between the radio-frequency terminal RF6 and the antenna terminal ANT have resistors R5, R6 respectively inserted in series therein. Terminals of these resistors R5, R6 on the through FET side are capacitively coupled to each other.

Furthermore, a capacitor C51a is provided between the ground and a node between the resistor R5 and an output terminal of the driver 15. A capacitor C61a is provided between the ground and a node between the resistor R6 and an output terminal of the driver 16.

The resistors R3-R6 have a high resistance, such as 10 kΩ, and the capacitors C31a, C41a, C51a, C61a have a high capacitance, such as several pF order. Hence, an input side of the resistors R3-R6 is nearly equivalent to being grounded for a radio-frequency signal at approximately 1-2 GHz. It is noted that in FIG. 4, capacitors C32a, C42a, C52a, C62a are capacitances to ground of the control signal lines Con3a, Con4a, Con5a, Con6a, respectively, and the typical value thereof is several ten to several hundred fF order.

Suppose now that conduction is established between the radio-frequency terminal RF3 and the antenna terminal ANT. A path between each of the other radio-frequency terminals RF1-RF2, RF4-RF6 and the antenna terminal ANT is in the blocked state. At this time, the through FETs T31-T3n are in the on-state. When a radio-frequency signal inputted from the radio-frequency terminal RF3 passes through the through FETs T31-T3n, the radio-frequency signal leaks to the control signal line Con3a via the gate capacitance of the through FETs T31-T3n. Because the control signal line Con3a has a high resistance R3 inserted therein, the control signal line Con3a has high impedance, and the radio-frequency signal is superimposed on the control signal line Con3a. Furthermore, the control signal line Con4a, which is capacitively coupled to the control signal line Con3a via a capacitance Cx34, also has a high resistance R4 inserted therein and has high impedance. Thus, the radio-frequency signal is superimposed also on the control signal line Con4a via the capacitance Cx34.

A phase difference between the radio-frequency signal inputted from the radio-frequency terminal RF3 and the radio-frequency signal superimposed on the control signal line Con4a can be easily set to 60° by adjusting the parallel-connected resistance of the resistors RT31-RT3n, the capacitances to ground C32a, C42a of the control signal lines Con3a, Con4a, the coupling capacitance Cx34, and the resistance of the resistors R3, R4, and it is set that in this embodiment. Thus, the radio-frequency signal having a phase difference of 60° with respect to the radio-frequency signal inputted from the radio-frequency terminal RF3 is applied to the gate of the through FETs T41-T4n in the off-state via the control signal line Con4a.

The original radio-frequency signal without 60 degrees phase shift is applied between the drain and the source of the through FETs T41-T4n. This radio-frequency signal causes third-order off-distortion (referred to as first distortion) in the through FETs T41-T4n. In addition, the aforementioned radio-frequency signal with a phase difference of 60 degrees applied to the gate via the control signal line Con4a also causes third-order off-distortion (referred to as second distortion). Because of the 60 degrees phase difference in a fundamental frequency, the phase difference between the third-order first distortion and the third-order second distortion is three times 60 degrees, that is, 180 degrees.

Hence, when the second distortion has a suitable intensity, the second distortion can cancel out sum of the aforementioned first distortion for the through FETs in the off-state connected to the radio-frequency terminal RF4 and the third-order off-distortion generated by the through FETs in the off-state connected to the radio-frequency terminals RF1-RF2, RF5-RF6.

Furthermore, the radio-frequency terminal RF3 and the radio-frequency terminal RF4 are equivalent. Thus, IMD3 can be reduced not only in the case where conduction is established between the radio-frequency terminal RF3 and the antenna terminal ANT, but also in the case where conduction is established between the radio-frequency terminal RF4 and the antenna terminal ANT whereas the path between each of the other radio-frequency terminals RF1-RF3, RF5-RF6 and the antenna terminal ANT is in the blocked state.

The same applies also to another pair. Suppose now that conduction is established between the radio-frequency terminal RF5 and the antenna terminal ANT. A path between each of the other radio-frequency terminals RF1-RF4, RF6 and the antenna terminal ANT is in the blocked state. At this time, the through FETs T51-T5n are in the on-state. When a radio-frequency signal inputted from the radio-frequency terminal RF5 passes through the through FETs T51-T5n, the radio-frequency signal leaks to the control signal line Con5a via the gate capacitance of the through FETs T51-T5n. Because the control signal line Con5a has a high resistance R5 inserted therein, the control signal line Con5a has high impedance, and the radio-frequency signal is superimposed on the control signal line Con5a. Furthermore, the control signal line Con6a, which is capacitively coupled to the control signal line Con5a via a capacitance Cx56, also has a high resistance R6 inserted therein and has high impedance. Thus, the radio-frequency signal is superimposed also on the control signal line Con6a via the capacitance Cx56.

A phase difference between the radio-frequency signal inputted from the radio-frequency terminal RF5 and the radio-frequency signal superimposed on the control signal line Con6a can be easily set to 60 degrees by adjusting the parallel-connected resistances of the resistors RT51-RT5n, the capacitances to ground C52a, C62a of the control signal lines Con5a, Con6a, the coupling capacitance Cx56, and the resistance of the resistors R5, R6, and it is set that in this embodiment. Thus, the radio-frequency signal having a phase difference of 60 degrees with respect to the radio-frequency signal inputted from the radio-frequency terminal RF5 is applied to the gate of the through FETs T61-T6n in the off-state via the control signal line Con6a.

The original radio-frequency signal without 60 degrees phase shift is applied between the drain and the source of the through FETs T61-T6n. This radio-frequency signal causes third-order off-distortion (referred to as first distortion) in the through FETs T61-T6n. In addition, the aforementioned radio-frequency signal with a phase difference of 60 degrees applied to the gate via the control signal line Con6a also causes third-order off-distortion (referred to as second distortion). Because of the 60 degrees phase difference in the fundamental frequency, the phase difference between the third-order first distortion and the third-order second distortion is three times 60 degrees, that is, 180 degrees.

Hence, when the second distortion has a suitable intensity, the second distortion can cancel out sum of the aforementioned first distortion for the through FETs in the off-state connected to the radio-frequency terminal RF6 and the third-order off-distortion generated by the through FETs in the off-state connected to the radio-frequency terminals RF1-RF4.

Furthermore, the radio-frequency terminal RF5 and the radio-frequency terminal RF6 are equivalent. Thus, IMD3 can be reduced not only in the case where conduction is established between the radio-frequency terminal RF5 and the antenna terminal ANT, but also in the case where conduction is established between the radio-frequency terminal RF6 and the antenna terminal ANT whereas the path between each of the other radio-frequency terminals RF1-RF5 and the antenna terminal ANT is in the blocked state.

Although an SP6T (single-pole 6-throw) switch is taken as an example in this embodiment, it is understood that the invention is generally applicable to SPnT (where n is an integer of two or more) switches.

Third Embodiment

Figure 5:
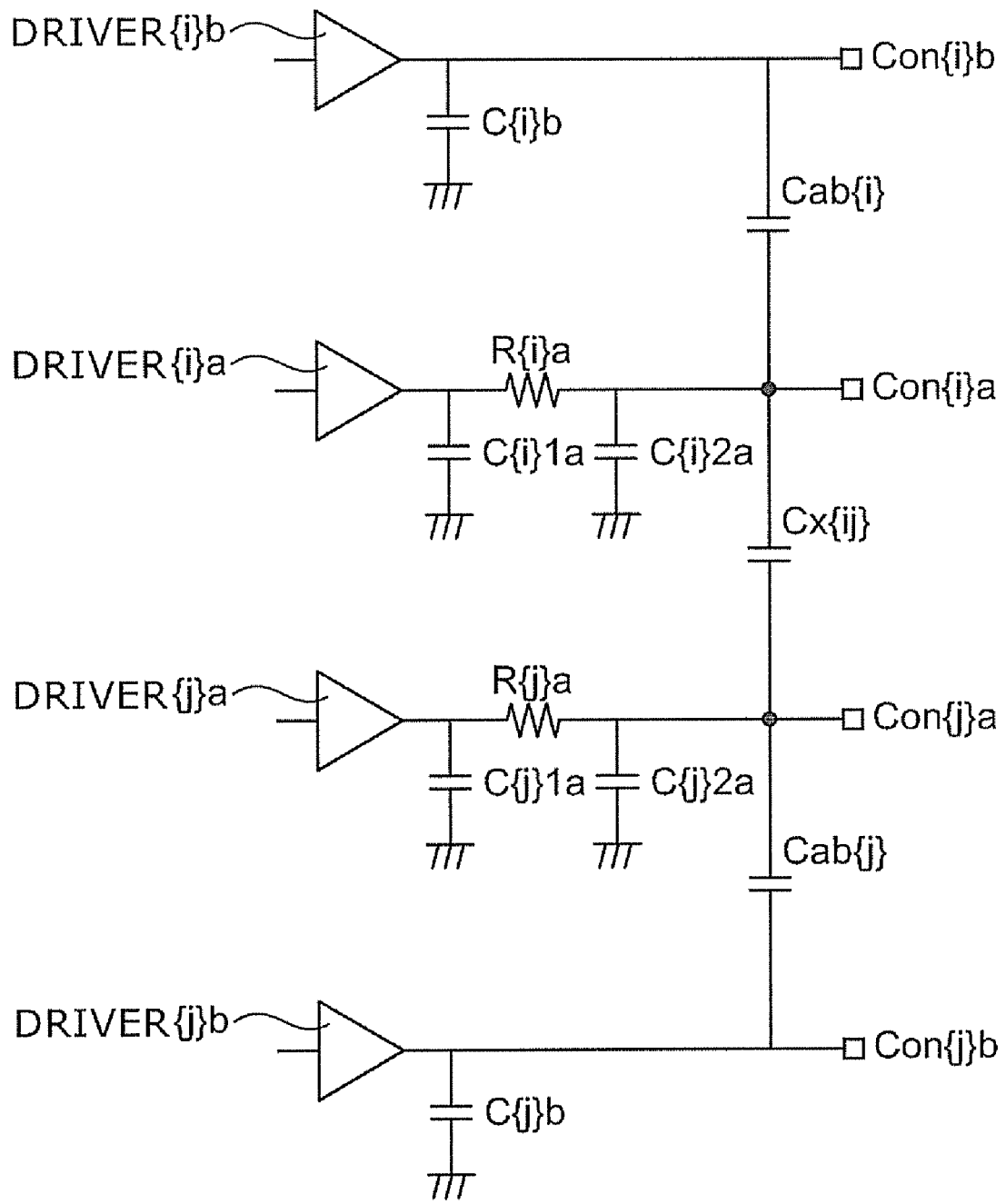
FIG. 5 is a circuit diagram illustrating a control circuit section in a radio-frequency switch circuit according to a third embodiment of the invention.
Figure 6:
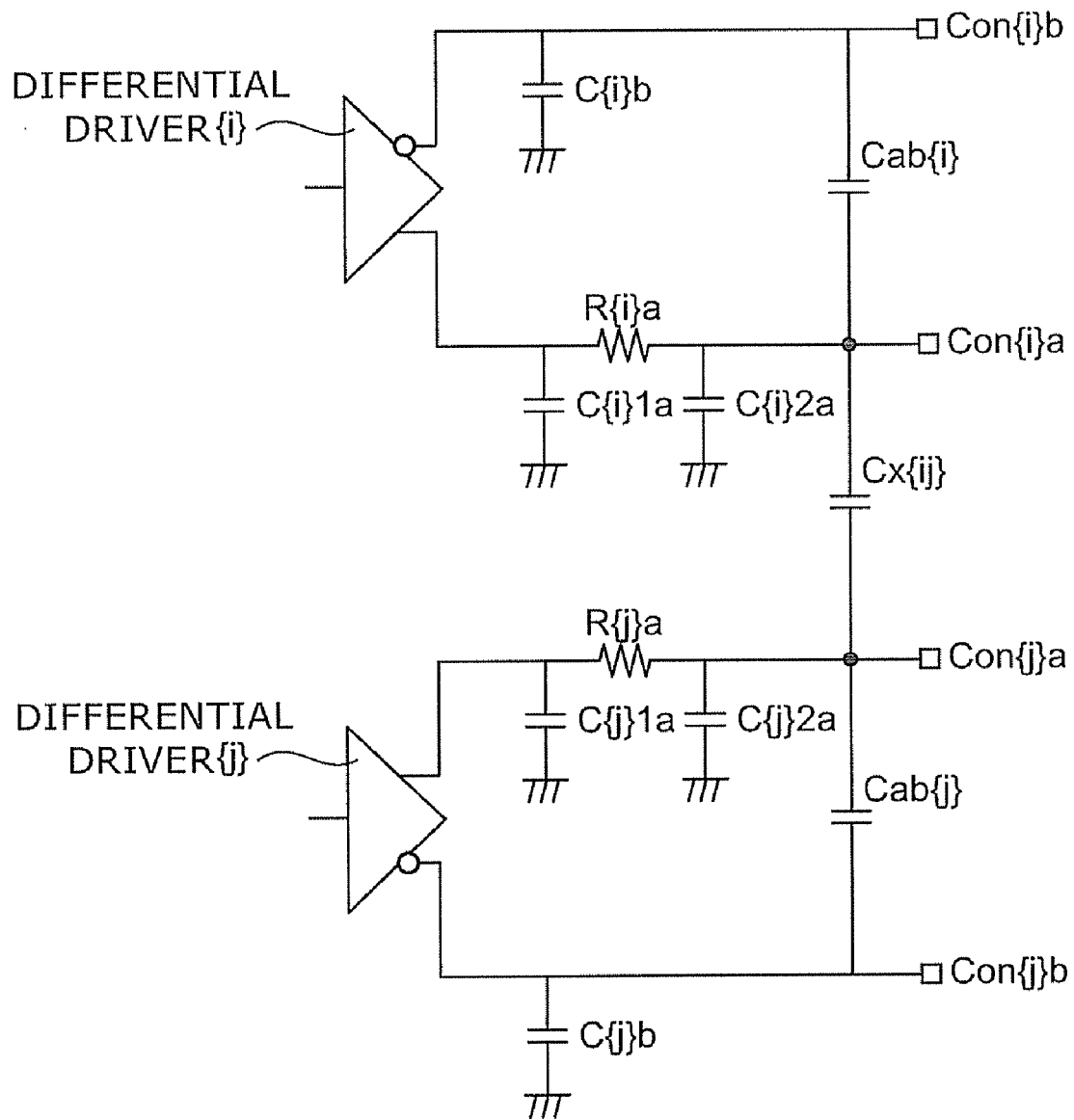
FIG. 6 is a circuit diagram illustrating a control circuit section in a radio-frequency switch circuit according to a third embodiment of the invention.

FIGS. 5 and 6 are circuit diagrams illustrating a control circuit section in a radio-frequency switch circuit according to a third embodiment of the invention. FIG. 5 shows drivers {i}a, {j}a, {i}b, {j}b for supplying a control signal to the gate of FETs. The drivers {i}a, {j}a, {i}b, {j}b are of the single-phase type. FIG. 6 shows drivers {i}, {j}. The drivers {i}, {j} are of the differential type.

To provide high impedance to control signal lines Con{i}a, Con{j}a for driving the gate of through FETs, the control signal lines Con{i}a, Con{j}a have resistors R{i}a, R{j}a respectively inserted therein. And the control signal line Con{i}a and the control signal line Con{j}a are connected via a coupling capacitance Cx{ij}.

In the planar layout, control signal lines Con{i}b, Con{j}b are formed on both sides of the aforementioned pair of control signal lines in the manner of sandwiching the pair of control signal lines from outside. The control signal lines Con{i}b, Con{j}b are decoupled so as to be equivalent to the ground line in terms of radio frequency. The control signal line Con{i}b is a control signal line for driving the gate of shunt FETs connected to the same radio-frequency terminal as the through FETs having the gate connected to the control signal line Con{i}a. The control signal line Con{j}b is a control signal line for driving the gate of shunt FETs connected to the same radio-frequency terminal as the through FETs having the gate connected to the control signal line Con{j}a.

In implementing the embodiments of the invention described above, the intensity and phase of the radio-frequency signal superimposed on the control signal lines of through FETs need to be accurately adjusted. Hence, the capacitance to ground of the control signal lines and the coupling capacitance of the pair of control signal lines need to be accurately controlled.

Thus, the control signal line Con{i}a and the control signal line Con{j}a are laid out adjacently and in parallel with a spacing therebetween to accurately configure the coupling capacitance Cx{ij} between the control signal line Con{i}a and the control signal line Con{j}a for through FETs in this embodiment.

Furthermore, the control signal line Con{i}b and the control signal line Con{j}b for shunt FETs are laid out adjacently and in parallel with a spacing to the capacitively coupled pair of control signal lines for through FETs in the manner of sandwiching this pair of control signal lines.

The control signal lines Con{i}b, Con{j}b for shunt FETs do not have high resistance inserted therein. The control signal lines Con{i}b, Con{j}b are decoupled so as to be equivalent to the ground line in terms of radio frequency.

The capacitance to ground of the control signal line Con{i}b is the sum of the capacitance C{i}b to the substrate backside and the like and the capacitance Cab{i} to the control signal line Con{i}a, where, typically, C{i}b<Cab{i}. Thus, the capacitance to ground can be adjusted by C{i}b. The capacitance Cab{i} is more controllable. Likewise, the capacitance to ground of the control signal line Con{j}b is the sum of the capacitance C{j}b to the substrate backside and the like and the capacitance Cab{j} to the control signal line Con{j}a, where, typically, C{j}b<Cab{j}. Thus, the capacitance to ground can be adjusted by C{j}b. The capacitance C{j}b is more controllable.

Furthermore, the control signal lines Con{i}b, Con{j}b for shunt FETs serving as ground lines in terms of radio frequency also serve as a shield. It is effective in preventing capacitive coupling of the aforementioned pair of control signal lines for through FETs to other signal lines. It is understood that the control signal lines Con{i}b, Con{j}b for shunt FETs may be replaced by ground lines.

Fourth Embodiment

Figure 7:
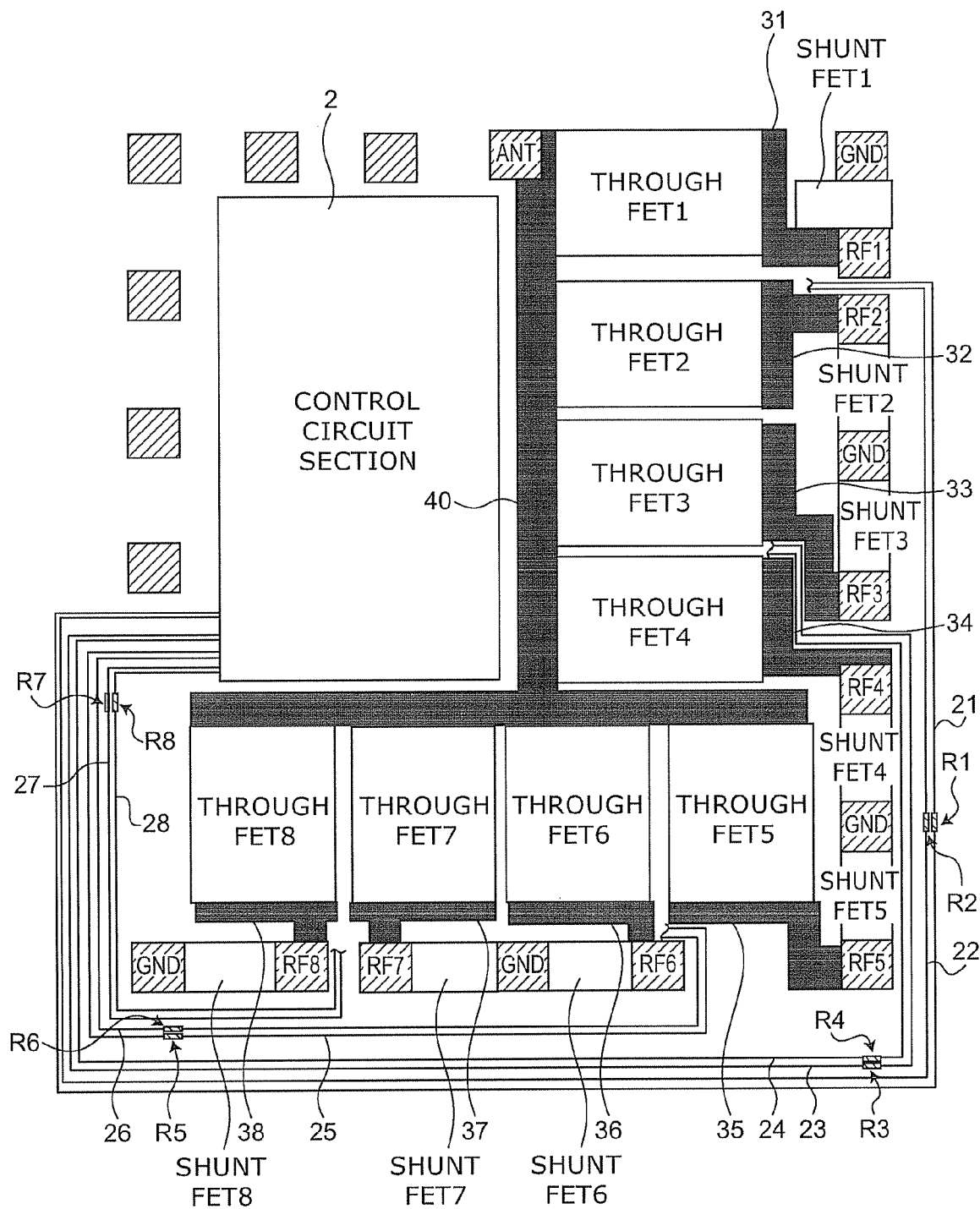
FIG. 7 is a schematic view showing a planar layout of major components on a semiconductor substrate (semiconductor chip) in a radio-frequency switch circuit according to a fourth embodiment of the invention.

The fourth embodiment is an application of the invention to an SP8T (single-pole 8-throw) switch. FIG. 7 shows a planar layout of major components on a semiconductor substrate (semiconductor chip).

An antenna terminal ANT and radio-frequency terminals RF1-RF8 are formed as pads. An n-stage through FET1 is connected to the antenna terminal ANT via an interconnect 40 and connected to the radio-frequency terminal RF1 via an interconnect 31. An n-stage through FET2 is connected to the antenna terminal ANT via an interconnect 40 and connected to the radio-frequency terminal RF2 via an interconnect 32. An n-stage through FET3 is connected to the antenna terminal ANT via an interconnect 40 and connected to the radio-frequency terminal RF3 via an interconnect 33. An n-stage through FET4 is connected to the antenna terminal ANT via an interconnect 40 and connected to the radio-frequency terminal RF4 via an interconnect 34. An n-stage through FET5 is connected to the antenna terminal ANT via an interconnect 40 and connected to the radio-frequency terminal RF5 via an interconnect 35. An n-stage through FET6 is connected to the antenna terminal ANT via an interconnect 40 and connected to the radio-frequency terminal RF6 via an interconnect 36. An n-stage through FET7 is connected to the antenna terminal ANT via an interconnect 40 and connected to the radio-frequency terminal RF7 via an interconnect 37. An n-stage through FET8 is connected to the antenna terminal ANT via an interconnect 40 and connected to the radio-frequency terminal RF8 via an interconnect 38.

Gates of the through FET1-8 are connected to the control circuit section 2 via control signal lines 21-28, respectively. The control signal lines 21-28 have high resistances R1-R8 respectively inserted therein. For example, terminals of the resistors R1 and R2 on the through FET side are capacitively coupled to each other. Terminals of the resistors R3 and R4 on the through FET side are capacitively coupled to each other. Terminals of the resistors R5 and R6 on the through FET side are capacitively coupled to each other. Terminals of the resistors R7 and R8 on the through FET side are capacitively coupled to each other.

The control signal lines 21-28 for the through FET1-8 have high impedance because of the high resistances R1-R8 respectively inserted therein. And the control signal lines 21-28 are susceptible to capacitive coupling to other radio-frequency signal lines. Any coupling other than the coupling capacitance Cx{ij} described in the above embodiments may decrease the effect of IMD3 improvement.

Hence, the control signal lines 21-28 are preferably laid out so as to avoid intersection with other interconnects for transmitting radio-frequency signals as in the interconnection example shown in FIG. 7.

Furthermore, the control signal lines 21-28 are preferably laid out so that line lengths from the high resistances R1-R8 to the through FET1-8 are substantially equal. Thus, the capacitance to ground of the control signal lines 21-28 for through FETs and the coupling capacitance Cx{ij} between the paired control signal lines 21-28 can be easily adjusted using the interconnect length.

Fifth Embodiment

Figure 10:
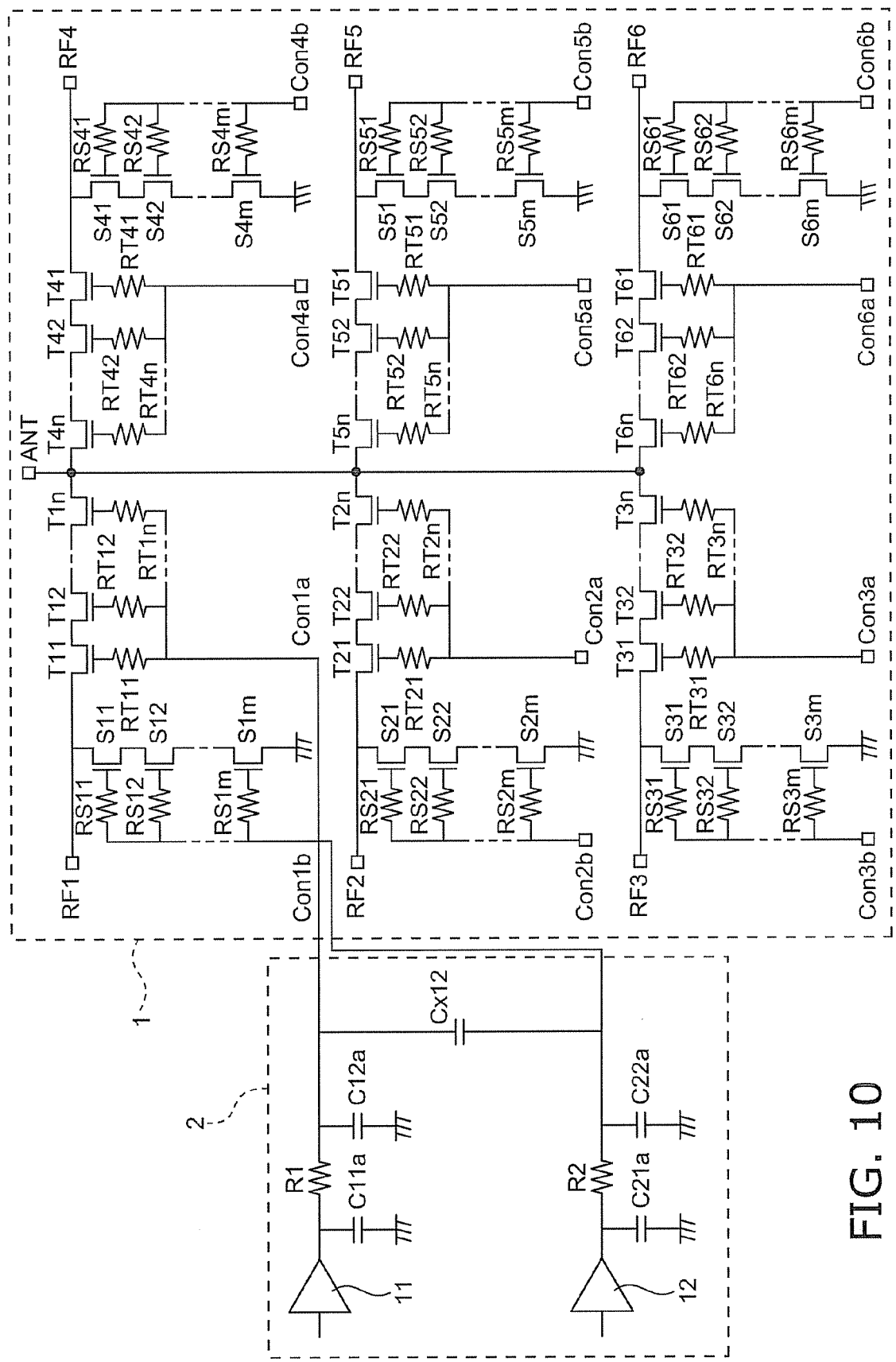
FIG. 10 is a circuit diagram illustrating a radio-frequency switch circuit according to a fifth embodiment of the invention.

FIG. 10 is a circuit diagram illustrating a radio-frequency switch circuit according to a fifth embodiment of the invention. The same elements as those described in the previous embodiments are labeled with like reference numerals, and the detailed description thereof is omitted.

The through FETs T11-T1n and shunt FETs S11-S1m are connected to the same radio-frequency terminal (radio-frequency terminal RF1 in the example of FIG. 10). The control signal line Con1$a$ drives the gate of the through FETs T11-T1n. The control signal line Con1$b$ drives the gate of the shunt FETs S11-S1m. The control signal line Con1$a$ has a high-resistance resistor R1 inserted in series therein. The control signal line Con1$b$ has a high-resistance resistor R2 inserted in series therein. The control signal line Con1$a$ and the control signal line Con1$b$ are capacitively coupled.

The resistors R1, R2 have a high resistance, such as 10 kΩ. The capacitors C11$a$, C21$a$ have a high capacitance, such as several pF order. Hence, an input side of the resistors R1, R2 is nearly equivalent to being grounded for a radio-frequency signal at approximately 1-2 GHz. It is noted that C12$a$, C22$a$ are capacitances to ground of the control signal lines Con1$a$, Con2$a$, respectively, and the typical value thereof is several ten to several hundred fF.

Suppose now that conduction is established between the radio-frequency terminal RF1 and the antenna terminal ANT. The path between each of the other radio-frequency terminals RF2-RF6 and the antenna terminal ANT is in the blocked state. At this time, the through FETs T11-T1$n$ are in the on-state. When a radio-frequency signal inputted from the radio-frequency terminal RF1 passes through the through FETs T11-T1n, the radio-frequency signal leaks to the control signal line Con1$a$ via the gate capacitance of the through FETs T11-T1n. Because the control signal line Con1$a$ has a high resistance R1 inserted therein, the control signal line Con1$a$ has high impedance, and the radio-frequency signal is superimposed on the control signal line Con1$a$.

Furthermore, the control signal line Con1$b$, which is capacitively coupled to the control signal line Con1$a$ via the capacitance Cx12, also has a high resistance R2 inserted therein and has high impedance. Thus, the radio-frequency signal is superimposed also on the control signal line Con1$b$ via the capacitance Cx12. Via the RC circuit network like this, part of the radio-frequency signal inputted from the radio-frequency terminal RF1 is superimposed on the control signal line Con1$b$ with a certain phase difference.

The impedance of the gate capacitance of the through FETs T11-T1n in the on-state is sufficiently smaller than the high resistance RT11-RT1n connected to the associated gate. Hence, the impedance of the gate capacitance of the through FETs T11-T1n in the on-state is negligible in considering the aforementioned RC circuit network. Thus, in the aforementioned RC circuit network, it is necessary to consider only the parallel-connected resistance of the resistors RT11-RT1n, the capacitances to ground C12$a$, C22$a$ of the control signal lines Con1$a$, Con1$b$, the coupling capacitance Cx12, and the resistors R1, R2.

By adjusting these capacitances and resistances, the phase difference between the radio-frequency signal inputted from the radio-frequency terminal RF1 and the radio-frequency signal superimposed on the control signal line Con1$b$ can be easily set to 60 degrees, and it is set so in this embodiment. Thus, the radio-frequency signal having a phase difference of 60 degrees with respect to the radio-frequency signal inputted from the radio-frequency terminal RF1 is applied to the gate of the shunt FETs S11-S1m in the off-state via the control signal line Con1$b$.

The original radio-frequency signal without 60 degrees phase shift is applied between the drain and the source of the shunt FETs S11-S1m connected to the radio-frequency terminal RF1. This radio-frequency signal causes third-order off-distortion (referred to as first distortion) in the shunt FETs S11-S1m. In addition, the aforementioned radio-frequency signal with a phase difference of 60 degrees applied to the gate via the control signal line Con1$b$ also causes third-order off-distortion (referred to as second distortion). Because of the 60 degrees phase difference in the fundamental frequency, the phase difference between the third-order first distortion and the third-order second distortion is three times 60 degrees, that is, 180 degrees.

Hence, when the second distortion has a suitable intensity, the aforementioned first distortion for the shunt FETs S11-S1m in the off-state connected to the radio-frequency terminal RF1 can be canceled out by the aforementioned second distortion. Thus, also in this embodiment, IMD3 can be reduced without increasing the number of stages of through FETs, and hence reduction of IMD3 does not involve increased chip area.

Figure 12:
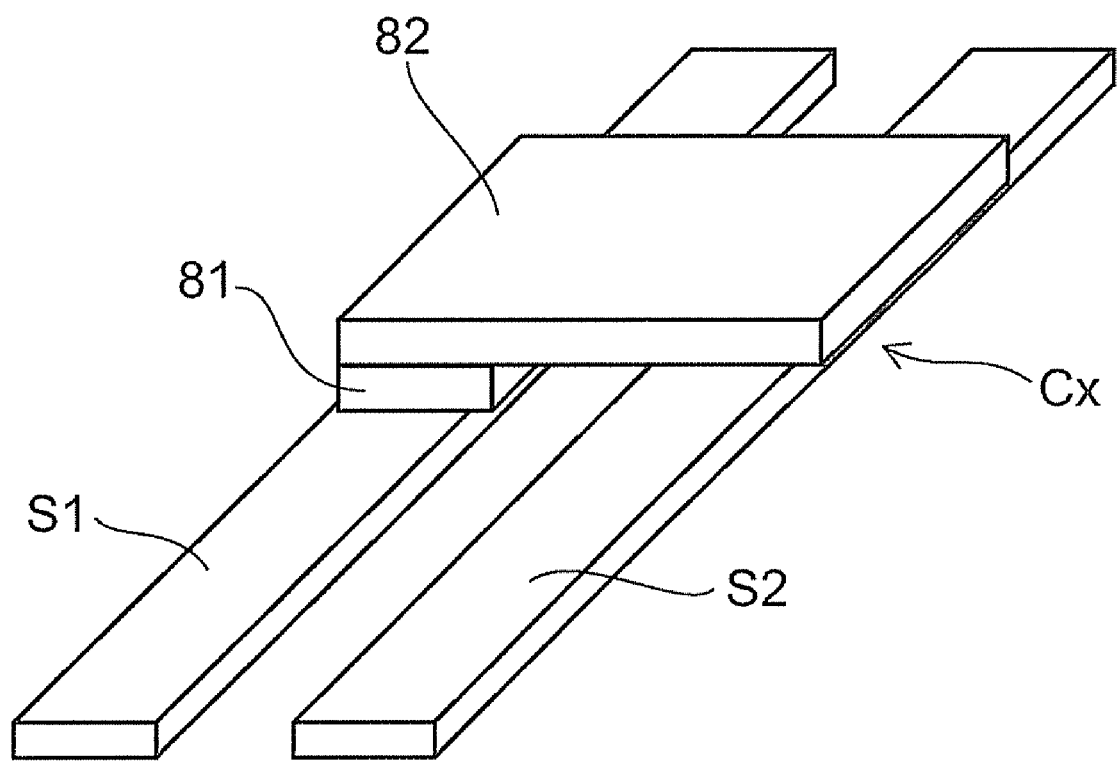
FIG. 12 is a schematic view showing a capacitive coupling via a MIM structure with a pair of control signal lines.

FIG. 12 is a schematic view of a portion of control signal lines S1, S2, which are wired in parallel and adjacently on a semiconductor substrate to sandwich an insulating layer, not shown, and capacitively coupled via a MIM (metal-insulator-metal) structure in this portion. The control signal lines S1, S2 correspond to the aforementioned control signal lines Con1$a$, Con1$b$, and are formed as metal layers.

One control signal line S1 is in conduction with an overlying metal layer 82 through a metal via 81, and the metal layer 82 is opposed to part of the other control signal line S2 through the intermediary of the insulating layer (or dielectric layer), not shown. By suitably designing this MIM structure portion, a desired coupling capacitance Cx can be accurately designed to ensure the aforementioned distortion cancellation.

The structure of FIG. 12 is not limited to the pair of control signal lines Con1$a$, Con1$b$, but applicable to any pair of control signal lines being capacitively coupled.

Each control signal line of the capacitively coupled pair has high impedance because of the high resistance inserted therein, and is susceptible to capacitive coupling to other radio-frequency signal lines. Any coupling other than the desired coupling capacitance Cx may decrease the effect of IMD3 improvement. Hence, the control signal lines are preferably laid out so as to avoid intersection with other interconnects for transmitting radio-frequency signals.

Figure 11:
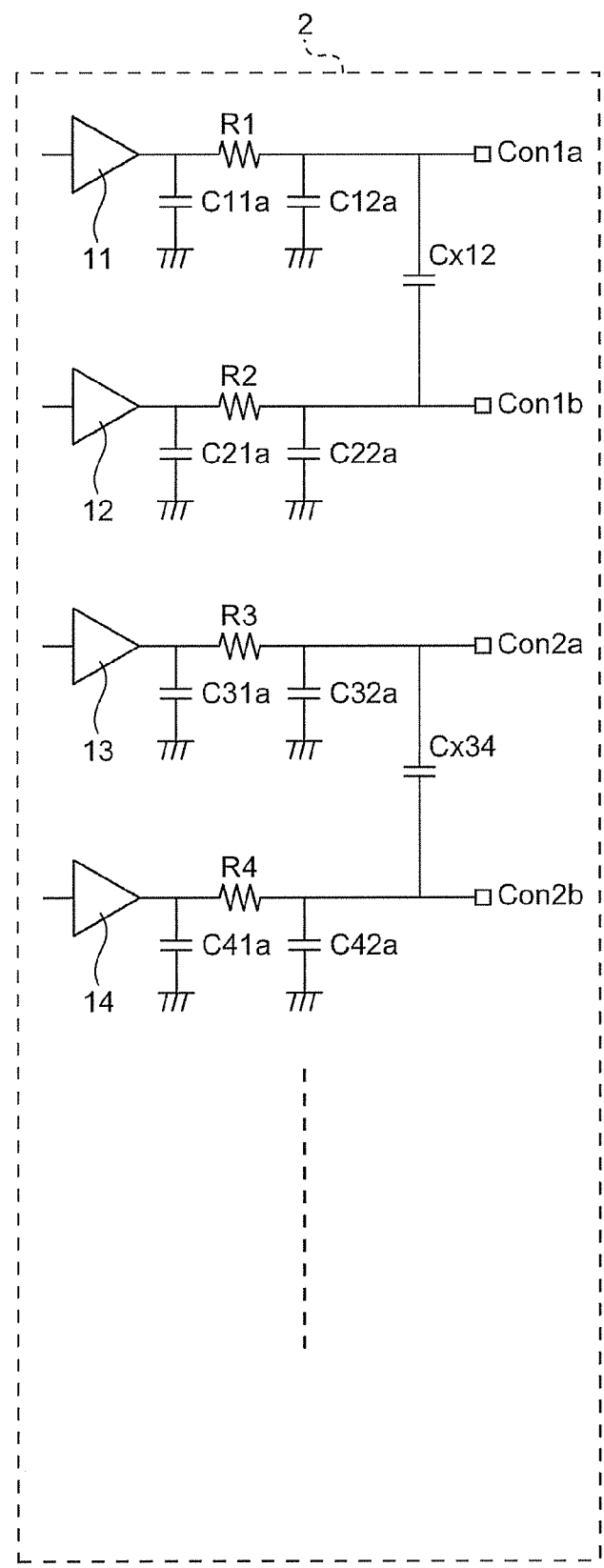
FIG. 11 is a circuit diagram illustrating a control circuit section in a radio-frequency switch circuit according to a fifth embodiment of the invention.

FIG. 11 is a circuit diagram illustrating the control circuit section 2 in a radio-frequency switch circuit according to this embodiment.

In the fifth embodiment described above, the control signal line Con1$a$ for the through FETs T11-T1n connected to the radio-frequency terminal RF1 and the control signal line Con1$b$ for the shunt FETs S11-S1m connected to the same radio-frequency terminal RF1 have resistors R1, R2 inserted therein and are capacitively coupled. The fifth embodiment can be applied to the other control signal lines to allow IMD3 improvement for all the radio-frequency terminals RF1-RF6.

More specifically, the control signal line Con2a connected to the gate of the through FETs T21-T2n connected to the radio-frequency terminal RF2 and the control signal line Con2b connected to the gate of the shunt FETs S21-S2m connected to the same radio-frequency terminal RF2 have resistors R3, R4 respectively inserted in series therein. Terminals of these resistors R3, R4 on the through FET side and the shunt FET side are capacitively coupled to each other.

Furthermore, a capacitor C31a is provided between the ground, and the node between the resistor R3 and the output terminal of the driver 13 for driving the gate of the through FETs T21-T2n. A capacitor C41a is provided between the ground, and the node between the resistor R4 and the output terminal of the driver 14 for driving the gate of the shunt FETs S21-S2m.

Likewise, also for the other radio-frequency terminals, the control signal line connected to the gate of through FETs and the control signal line connected to the gate of shunt FETs connected to the same radio-frequency terminal have resistors respectively inserted in series therein. Terminals of these resistors on the through FET side and the shunt FET side are capacitively coupled to each other.

The resistors R1, R2, R3, R4, . . . have a high resistance, such as 10 kΩ, and the capacitors C11a, C21a, C31a, C41a, . . . have a high capacitance, such as several pF order. Hence, for a radio-frequency signal at approximately 1-2 GHz, the input side of the resistors R1, R2, R3, R4, . . . is nearly equivalent to being grounded. It is noted that the typical value of the capacitances to ground C12a, C22a, C32a, C42a, . . . of the control signal lines Con1a, Con1b, Con2a, Con2b, . . . , respectively, is several ten to several hundred fF.

Suppose, for example, that the through FETs T21-T2n connected to the radio-frequency terminal RF2 are in the on-state and the through FETs connected to the other radio-frequency terminals are in the off-state. When a radio-frequency signal inputted from the radio-frequency terminal RF2 passes through the through FETs T21-T2n, the radio-frequency signal leaks to the control signal line Con2a via the gate capacitance of the through FETs T21-T2n. Because the control signal line Con2a has a high resistance R3 inserted therein, the control signal line Con2a has high impedance. Thus, the radio-frequency signal is superimposed on the control signal line Con2a. Furthermore, the control signal line Con2b, which is capacitively coupled to the control signal line Con2a via the capacitance Cx34, also has a high resistance R4 inserted therein and has high impedance. Thus, the radio-frequency signal is superimposed also on the control signal line Con2b via the capacitance Cx34.

By adjusting the parallel-connected resistance of the resistors RT21-RT2n, the capacitances to ground C32a, C42a of the control signal lines Con2a, Con2b, the coupling capacitance Cx34, and the resistance of the resistors R3, R4, the phase difference between the radio-frequency signal inputted from the radio-frequency terminal RF2 and the radio-frequency signal superimposed on the control signal line Con2b is set to 60 degrees. Thus, the radio-frequency signal having a phase difference of 60 degrees with respect to the radio-frequency signal inputted from the radio-frequency terminal RF2 is applied to the gate of the shunt FETs S21-S2m in the off-state via the control signal line Con2b.

The original radio-frequency signal without 60 degrees phase shift is applied between the drain and the source of the shunt FETs S21-S2m. This radio-frequency signal causes third-order off-distortion (referred to as first distortion) in the shunt FETs S21-S2m. In addition, the aforementioned radio-frequency signal with a phase difference of 60 degrees applied to the gate via the control signal line Con2b also causes third-order off-distortion (referred to as second distortion). Because of the 60 degrees phase difference in the fundamental frequency, the phase difference between the third-order first distortion and the third-order second distortion is three times 60 degrees, that is, 180 degrees.

Hence, when the second distortion has a suitable intensity, the aforementioned first distortion for the shunt FETs S21-S2m in the off-state connected to the radio-frequency terminal RF2 can be canceled out by the aforementioned second distortion.

The same also applies to the pair of control signal lines for through FETs and shunt FETs connected to the other radio-frequency terminals.

Sixth Embodiment

Figure 8:
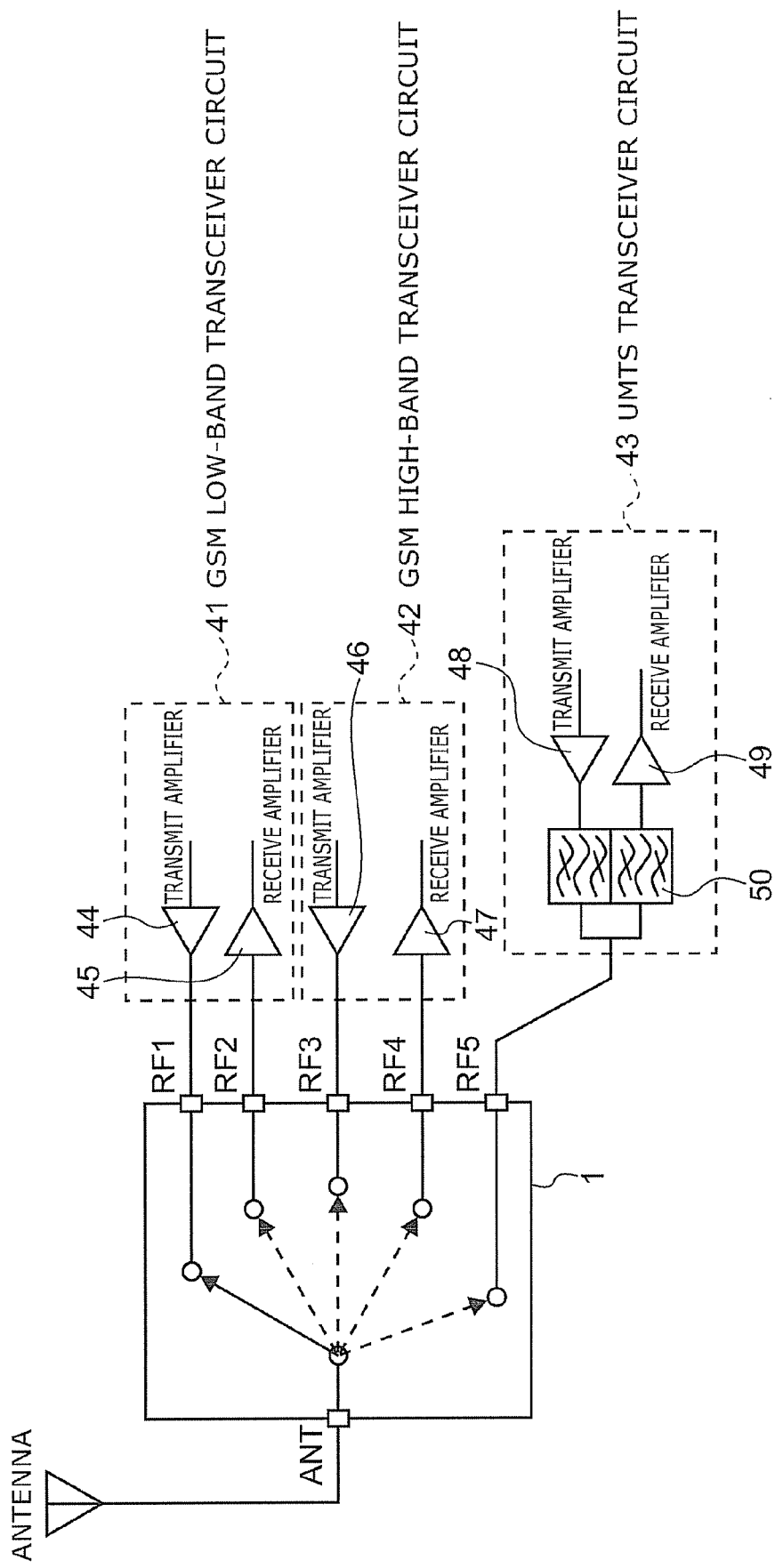
FIG. 8 is a configuration diagram of a radio frequency section of a mobile phone including the radio-frequency switch circuit according to embodiments of the invention.

FIG. 8 is a configuration diagram of a radio frequency section of a mobile phone including the radio-frequency switch circuit of the above embodiments.

The radio-frequency switch section 1 illustratively has an SP5T (single-pole 5-throw) switch for switching signal paths between the antenna terminal ANT and five radio-frequency terminals RF1-RF5.

An output terminal of a transmit amplifier 44 of a GSM (Global System for Mobile Communications) Low-band (900 MHz band) transceiver circuit 41 is connected to the radio-frequency terminal RF1, and an input terminal of a receive amplifier 45 thereof is connected to the radio-frequency terminal RF2. An output terminal of a transmit amplifier 46 of a GSM High-band (1800 MHz band) transceiver circuit 42 is connected to the radio-frequency terminal RF3, and an input terminal of a receive amplifier 47 thereof is connected to the radio-frequency terminal RF4.

The UMTS (Universal Mobile Telecommunications System) (2 GHz band) transceiver circuit 43 includes a duplexer 50 for splitting transmit/receive signals, a transmit amplifier 48, and a receive amplifier 49. By the duplexer 50, the receive signal from the radio-frequency terminal RF5 is carried to the receive amplifier 49, and the transmit signal from the transmit amplifier 48 is carried to the radio-frequency terminal RF5.

The embodiments of the invention described above can be applied to the radio-frequency switch section 1 and a control circuit section associated therewith to provide a radio-frequency switch circuit having reduced intermodulation distortion without increasing the chip size.

Such a multimode, multiband mobile phone is prone to the problem of intermodulation distortion particularly in the UMTS mode. Thus, preferably, the aforementioned high resistance is inserted in the control signal line for through FETs connected to the radio-frequency terminal RF5, and this control signal line is capacitively coupled to another control signal line with a high resistance inserted therein. This configuration enhances the transmission quality of the mobile phone having the UMTS mode, and facilitates downsizing.

The embodiments of the invention have been described with reference to examples. However, the invention is not limited thereto, but various modifications are possible within the spirit of the invention.

The invention claimed is:

1. A radio-frequency switch circuit comprising:
   an antenna terminal;
   two or more radio-frequency terminals;
   n-stage through FETs (field effect transistors) connected in series between the antenna terminal and each of the radio-frequency terminals, where n is a natural number;

a radio-frequency leakage prevention resistor, one end of the radio-frequency leakage prevention resistor being connected to a gate of the through FETs;

a control signal line commonly connected to another ends of the radio-frequency leakage prevention resistors; and a resistor inserted in each of at least two of the control signal lines between the another end of the radio-frequency leakage prevention resistor and a control circuit supplying a control signal to the n-stage through FETs, each portion of the two control signal lines being capacitively coupled between the resistor and the another end of the radio-frequency leakage prevention resistor.

2. The switch circuit according to claim 1, wherein the capacitive coupling is achieved by wiring the two control signal lines adjacently and in parallel.

3. The switch circuit according to claim 2, wherein shunt FETs are connected between each of the radio-frequency terminals and the ground, and a ground line, or a control signal line for the shunt FETs decoupled so as to be equivalent to the ground line in terms of radio frequency, is wired on both sides of the pair of control signal lines wired in parallel.

4. The switch circuit according to claim 3, wherein when the through FETs connected to one of the radio-frequency terminals are turned on, the shunt FET connected to the same radio-frequency terminal and the other through FETs connected to the other radio-frequency terminals are turned off, and the other shunt FETs connected to the other radio-frequency terminals are turned on.

5. The switch circuit according to claim 3, wherein the through FET, the radio-frequency leakage prevention resistor, the control signal line, the resistor, and the shunt FET are formed on a single semiconductor substrate.

6. The switch circuit according to claim 2, wherein the pair of control signal lines wired in parallel is capacitively coupled via a MIM (metal-insulator-metal) structure.

7. The switch circuit according to claim 1, wherein the control signal lines are laid out so that wiring lengths from the resistors to the through FETs connected to the resistors are generally equal.

8. The switch circuit according to claim 1, wherein the control signal line does not intersect other interconnects on which a radio-frequency signal is transmitted.

9. The switch circuit according to claim 1, wherein a radio-frequency signal having a phase difference with respect to a radio-frequency signal inputted from the radio-frequency terminal is applied to gates of other ones of the through FETs in off-state connected to another control signal line.

10. The switch circuit according to claim 9, wherein the phase difference is 60 degrees in a fundamental frequency.

11. The switch circuit according to claim 1, wherein at least one of the radio-frequency terminals is connected to a UMTS (Universal Mobile Telecommunications System) transceiver circuit, and at least one of the pair of resistors capacitively coupled to each other is inserted in the control signal line corresponding to a radio-frequency terminal connected to a UMTS transceiver circuit.

12. A radio-frequency switch circuit comprising:

an antenna terminal;

two or more radio-frequency terminals;

n-stage through FETs (field effect transistors) connected in series between the antenna terminal and each of the radio-frequency terminals, where n is a natural number;

a through FET radio-frequency leakage prevention resistor, one end of the through FET radio-frequency leakage prevention resistor being connected to a gate of the through FETs;

a through FET control signal line commonly connected to another ends of the through FET radio-frequency leakage prevention resistors;

a through FET resistor inserted in the through FET control signal line between the another end of the through FET radio-frequency leakage prevention resistor and a control circuit supplying a control signal to the n-stage through FETs;

m-stage shunt FETs connected in series between each of the radio-frequency terminals and the ground, where m is a natural number;

a shunt FET radio-frequency leakage prevention resistor, one end of the shunt FET radio-frequency leakage prevention resistor being connected to a gate of the shunt FETs;

a shunt FET control signal line commonly connected to another ends of the shunt FET radio-frequency leakage prevention resistors; and a shunt FET resistor inserted in the shunt FET control signal line between the another end of the shunt FET radio-frequency leakage prevention resistor and the control circuit supplying a control signal to the m-stage shunt FETs, each portion of the through FET control signal line and the shunt FET control signal line being capacitively coupled, the portion of the through FET control signal line being provided between the through FET resistor and the another end of the through FET radio-frequency leakage prevention resistor, and the portion of the shunt FET control signal line being provided between the shunt FET resistor and the another end of the shunt FET radio-frequency leakage prevention resistor.

13. The switch circuit according to claim 12, wherein the capacitive coupling is achieved by wiring the through FET control signal line and the shunt FET control signal line adjacently and in parallel.

14. The switch circuit according to claim 13, wherein the through FET control signal line and the shunt FET control signal line wired in parallel is capacitively coupled via a MIM (metal-insulator-metal) structure.

15. The switch circuit according to claim 12, wherein the through FET control signal line and the shunt FET control signal line do not intersect other interconnects on which a radio-frequency signal is transmitted.

16. The switch circuit according to claim 12, wherein a radio-frequency signal having a phase difference with respect to a radio-frequency signal inputted from the radio-frequency terminal is applied to gates of the shunt FETs in off-state connected to the shunt FET control signal line via the shunt FET control signal line capacitively coupled to the through FET control signal line connected to the gates of the through FETs in on-state connected to the radio-frequency terminal.

17. The switch circuit according to claim 16, wherein the phase difference is 60 degrees in a fundamental frequency.

18. The switch circuit according to claim 12, wherein the radio-frequency terminal, commonly connected to the through FETs and the shunt FETs connected, respectively, to the through FET control signal line and the shunt FET control signal line which are capacitively coupled to each other, is connected to a UMTS (Universal Mobile Telecommunications System) transceiver circuit.

19. The switch circuit according to claim 12, wherein when the through FETs connected to one of the radio-frequency terminals are turned on, the shunt FET connected to the same radio-frequency terminal and the other through FETs connected to the other radio-frequency terminals are turned off, and the other shunt FETs connected to the other radio-frequency terminals are turned on.

20. The switch circuit according to claim 12, wherein the through FET, the through FET radio-frequency leakage prevention resistor, the through FET control signal line, the through FET resistor, the shunt FET, the shunt FET radio-frequency leakage prevention resistor, the shunt FET control signal line, and the shunt FET resistor are formed on a single semiconductor substrate.

* * * * *